United States Patent
Srivastava et al.

(10) Patent No.: US 7,808,279 B2
(45) Date of Patent: Oct. 5, 2010

(54) LOW POWER, SELF-GATED, PULSE TRIGGERED CLOCK GATING CELL

(75) Inventors: Anubhav Srivastava, Noida (IN); Abhishek Mahajan, Ghaziabad (IN); Neha Srivastava, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/503,059

(22) Filed: Jul. 14, 2009

(65) Prior Publication Data

US 2010/0109707 A1    May 6, 2010

(51) Int. Cl.
*H03K 19/00* (2006.01)
*H03K 5/05* (2006.01)
(52) U.S. Cl. .......................................... 326/93; 327/37
(58) Field of Classification Search ................. 326/93, 326/29; 327/291, 37, 176, 91
See application file for complete search history.

(56) References Cited

U.S. PATENT DOCUMENTS

| 5,498,988 | A | 3/1996 | Reyes et al. |
| 6,552,572 | B1 | 4/2003 | Cheung et al. |
| 6,822,478 | B2 | 11/2004 | Elappuparackal |
| 7,023,240 | B2 | 4/2006 | Elappuparackal |
| 2003/0006806 | A1 * | 1/2003 | Elappuparackal ............ 327/93 |

* cited by examiner

*Primary Examiner*—Daniel D Chang
(74) *Attorney, Agent, or Firm*—Charles Bergere

(57) ABSTRACT

A clock gating cell for gating clock signals includes a latch circuit, a comparison logic circuit, a first logic circuit, and a second logic circuit. An input signal is provided to the latch circuit. An input clock signal is provided to the first logic circuit. The first logic circuit switches the input clock signal based on a comparison signal generated by the comparison logic circuit, thereby generating a latch clock signal. The latch clock signal switches between a first state and a second state only when the input signal switches between the first state and the second state, thereby preventing power loss of the clock gating cell.

12 Claims, 9 Drawing Sheets

LOW POWER, SELF-GATED, PULSE TRIGGERED CLOCK GATING CELL

BACKGROUND OF THE INVENTION

The present invention relates generally to digital circuits, and more specifically, to clock gating cells used in digital circuits.

A clock signal is used in a digital circuit to synchronize the operation of various functional blocks of the digital circuit. A functional block may include a plurality of storage elements such as flip-flops or latches. A storage element changes its output based on a change in the levels of the clock signal that is received at a clock input of the storage element. However, during certain stages of the operation, storage elements in the functional blocks are not required to change their states based on the switching of the clock signal. Therefore, providing a continuous clock signal to the clock input of such storage elements results in power loss. The power loss is caused by the repetitive charging and discharging of the capacitive load associated with the clock input of the storage elements.

Therefore, in order to minimize power loss, clock signals are switched using additional logic circuitry to obtain gated clock signals. The gated clock signals switch states only when the logic states of the storage elements need to be changed. The additional logic circuitry is known as a clock gating cell.

Referring now to FIG. 1, a schematic diagram illustrating a conventional clock gating cell 100 is shown. The conventional clock gating cell 100 includes a negative latch 102, an input stage 104, a clock input stage 106, an output stage 108, and a logic AND gate 110. An input clock signal (CLK_IN) is provided to the clock input stage 106. An input signal (LAT_IN) is provided to the input stage 104. CLK_IN may periodically switch between a low state and a high state. When CLK_IN switches to a low state, LAT_IN gets latched at the output stage 108, i.e., an output signal (LAT_OUT) obtained from the output stage 108 becomes equal to LAT_IN. In contrast, when CLK_IN switches to high state, LAT_OUT remains in its previous state. Thereafter, LAT_OUT obtained from the output stage 108 and CLK_IN are provided to the input of the logic AND gate 110 to generate a gated clock signal (GATE_CLK).

Referring now to FIG. 2, a timing diagram illustrating an exemplary operation of the conventional clock gating cell 100 is shown. The timing diagram shows waveforms for an input clock signal (CLK_IN), an input signal (LAT_IN), an output signal (LAT_OUT), and a gated clock signal (GATE_CLK). At time t0, CLK_IN provided at the clock input stage 106 switches to high state. Subsequently, at time t1, LAT_IN provided at the input stage 104 becomes high. Since CLK_IN has switched to a high state, LAT_IN is not latched during the time between t1 and t2. GATE_CLK obtained at the output of the logic AND gate 110 remains low. At time t2, when CLK_IN switches to a low state, LAT_IN gets latched at the output stage 108, i.e., LAT_OUT obtained from the output stage 108 becomes equal to LAT_IN. Thereafter, at time t3, CLK_IN switches to a high state followed by GATE_CLK becoming high, since CLK_IN and LAT_OUT are provided at the input of the logic AND gate 110. Further, during the time between t3 and t4, GATE_CLK follows CLK_IN. Subsequently, at time t4, LAT_IN becomes low. Hence, LAT_IN is immediately latched at the output stage 108, i.e., LAT_OUT obtained from the output stage 108 becomes equal to LAT_IN. Consequently, LAT_OUT provided by the output stage 108 becomes low. The GATE_CLK thus generated switches only when LAT_OUT becomes high, thereby preventing power loss in the storage elements of the digital circuit.

However, in the conventional clock gating cell 100, CLK_IN continuously switches at the clock input stage 106 irrespective of whether LAT_IN is high or low. The continuous switching of CLK_IN causes continuous charging and discharging of the capacitive load associated with the clock input stage 106, thereby causing power loss in the conventional clock gating cell 100.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a clock gating cell for generating a gated clock signal is provided. The clock gating cell includes a latch circuit having at least one input stage that receives an input signal, a clock input stage that receives a latch clock signal, and at least one output stage that provides an output signal. The output signal changes based on the input signal and the latch clock signal. Further, the clock gating cell includes a comparison logic circuit, a first logic circuit, and a second logic circuit. The comparison logic circuit is connected to the at least one output stage. The comparison logic circuit compares the input signal and the output signal to generate a comparison signal. The comparison signal generated is provided to the input of the first logic circuit. The output of the first logic circuit is connected to the clock input stage and switches an input clock signal between a first state and a second state, thereby generating the latch clock signal. Finally, the output signal and the input clock signal are provided to the input of the second logic circuit to generate a gated clock signal.

In another embodiment of the present invention, a method for operating a clock gating cell is provided. The clock gating cell includes a latch circuit. An input signal and a latch clock signal are received by the latch circuit. An output signal is generated based on the input signal and the latch clock signal. Thereafter, the input signal and the output signal are compared to generate a comparison signal. Thereafter, an input clock signal is switched between a first state and a second state based on the comparison signal to generate the latch clock signal. Finally, a gated clock signal is generated based on the input clock signal and the output signal.

The present invention is directed to a clock gating cell. The clock gating cell generates a gated clock signal based on an input clock signal and an output signal. A latch clock signal is generated and provided to a clock input stage of the latch circuit in the clock gating cell. The latch clock signal switches only when the input signal switches, thereby eliminating continuous switching of the input clock signal at the clock input stage of the latch circuit. The elimination of continuous switching of the input clock signal at the clock input stage results in reduced charging and discharging of a capacitive load associated with the clock input stage of the latch circuit. Hence, the power loss of the clock gating cell is reduced.

Figure 1:
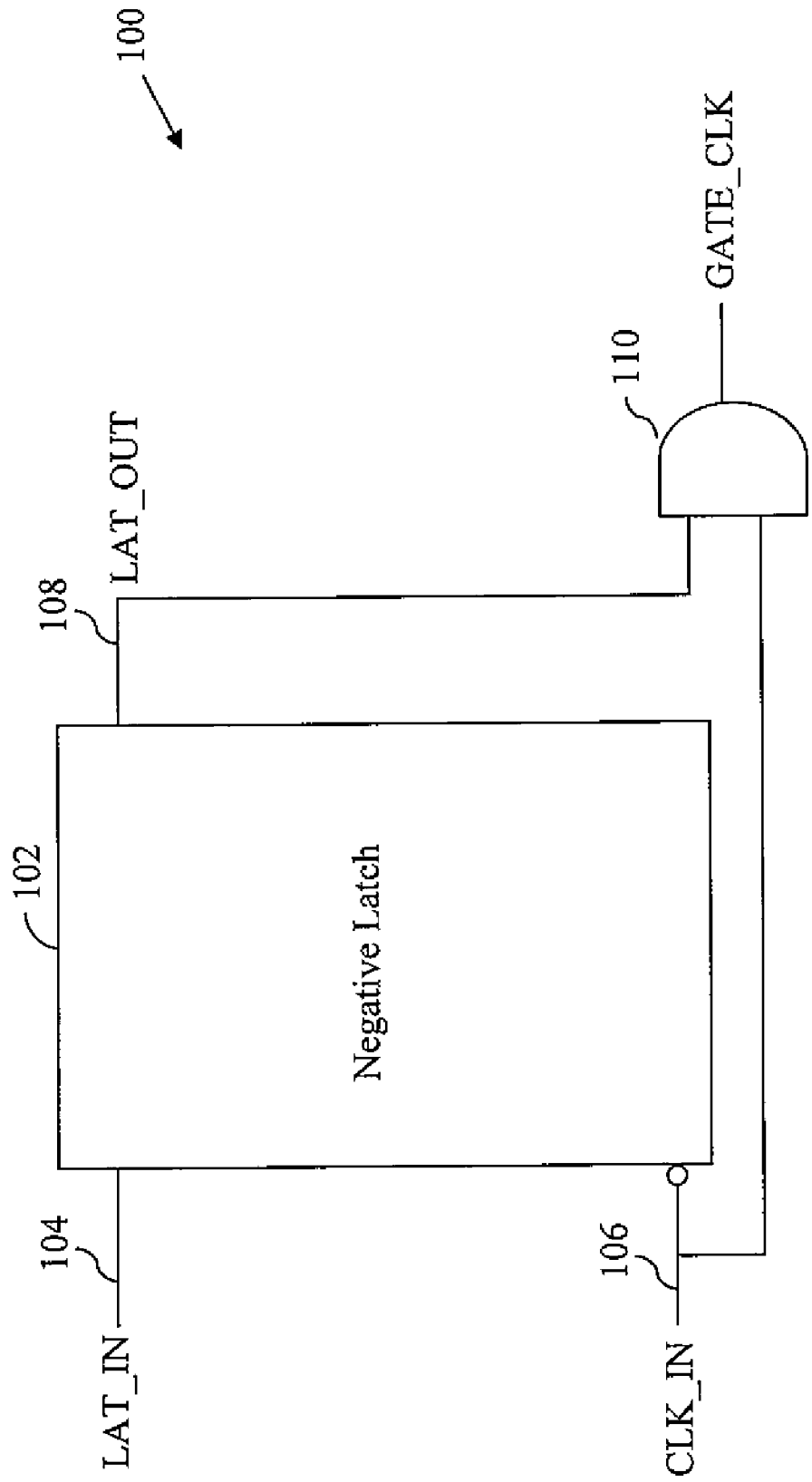
FIG. 1 is a schematic diagram illustrating a conventional clock gating cell.
Figure 2:
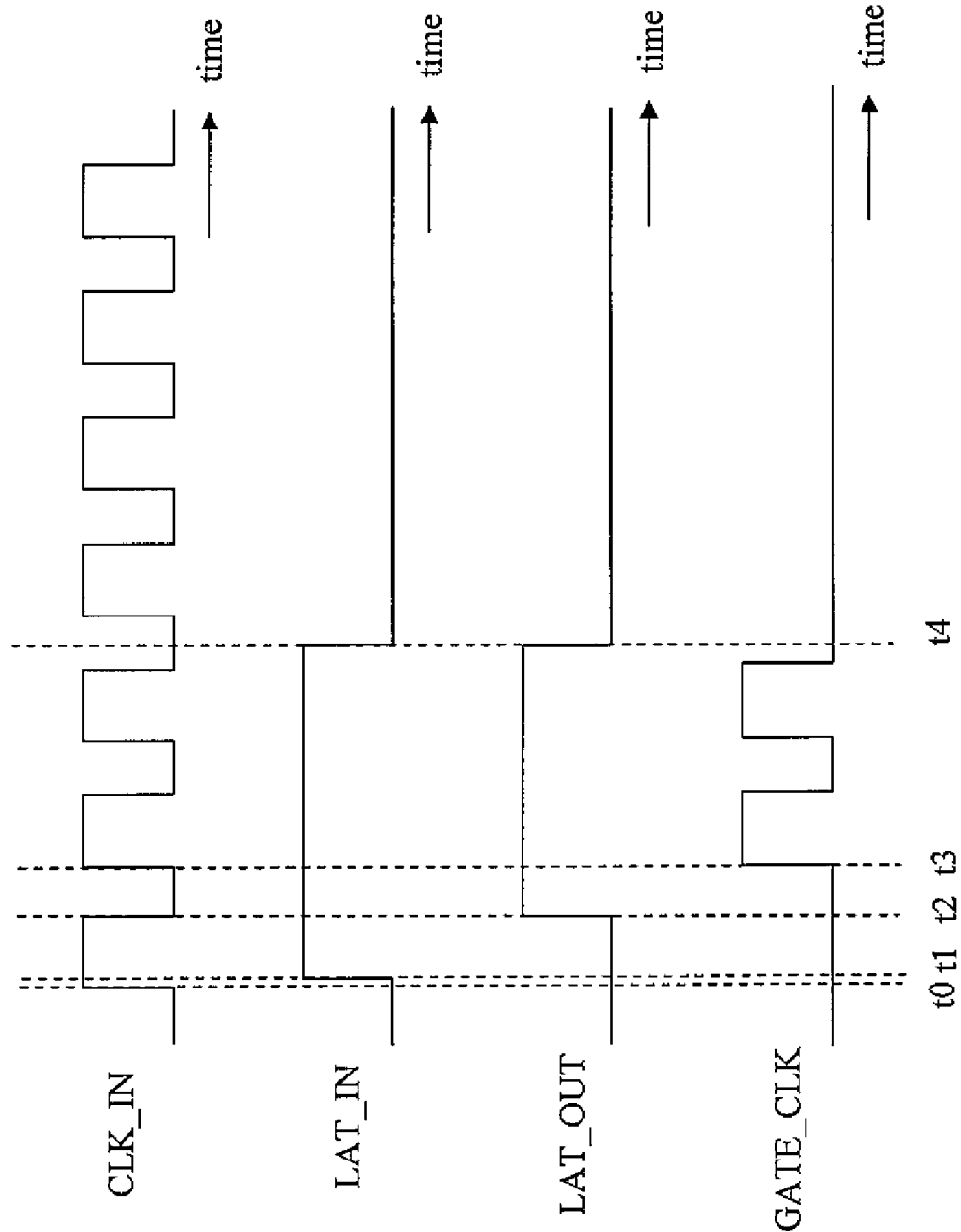
FIG. 2 is a timing diagram illustrating an exemplary operation of the conventional clock gating cell of FIG. 1.
Figure 3:
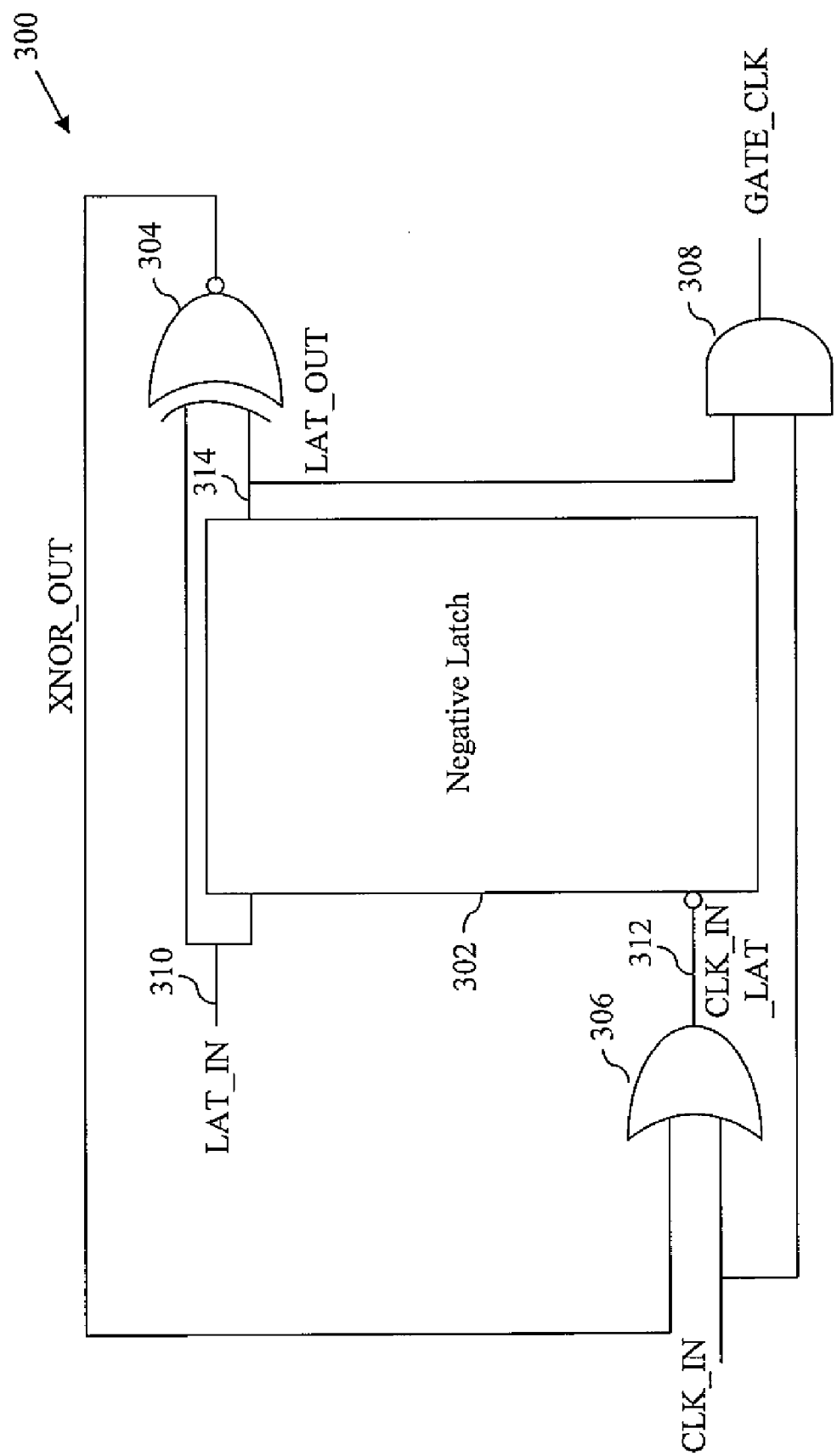
FIG. 3 is a schematic diagram illustrating a clock gating cell in accordance with an embodiment of the present invention.

Referring now to FIG. 3, a schematic diagram illustrating a clock gating cell 300 is shown, in accordance with an embodiment of the present invention. The clock gating cell 300 includes a negative latch circuit 302, a comparison logic circuit 304, a first logic circuit 306, and a second logic circuit 308. Further, the negative latch circuit 302 includes an input stage 310, a clock input stage 312, and an output stage 314.

An input signal (LAT_IN) is provided at the input stage 310 of the negative latch circuit 302. In an embodiment of the present invention, LAT_IN may be a data signal. An output signal (LAT_OUT) is obtained from the output stage 314. LAT_IN and LAT_OUT are provided to the input of comparison logic circuit 304. The comparison logic circuit 304 compares LAT_IN and LAT_OUT to generate a comparison signal (XNOR_OUT). XNOR_OUT and an input clock signal (CLK_IN) are provided to the input of the first logic circuit 306. The first logic circuit 306 switches CLK_IN between a first state and a second state based on XNOR_OUT, thereby generating a latch clock signal (CLK_IN_LAT). Thereafter, CLK_IN_LAT is provided to the clock input stage 312 to trigger a latch operation of the negative latch 302. Subsequently, LAT_OUT and CLK_IN are provided to the input of the second logic circuit 308. The second logic circuit 308 generates a gated clock signal (GATE_CLK) based on LAT_OUT and CLK_IN.

In various embodiments of the present invention, the comparison logic circuit 304 may be a logic XNOR gate. Further, the first logic circuit 306 may be a logic OR gate. The second logic circuit 308 may be a logic AND gate. Furthermore, the negative latch circuit 302 may have a plurality of input stages such as the input stage 310 and a plurality of output stages such as the output stage 314. In an embodiment of the present invention, the first state of CLK_IN may be high state and second state may be the low state or vice-versa.

In an embodiment of the present invention, the negative latch circuit 302 may be a negative D latch. In another embodiment of the present invention, the negative latch circuit 302 may be a negative SR latch. In yet another embodiment of the present invention, the negative latch circuit 302 may be a negative JK latch.

Figure 4:
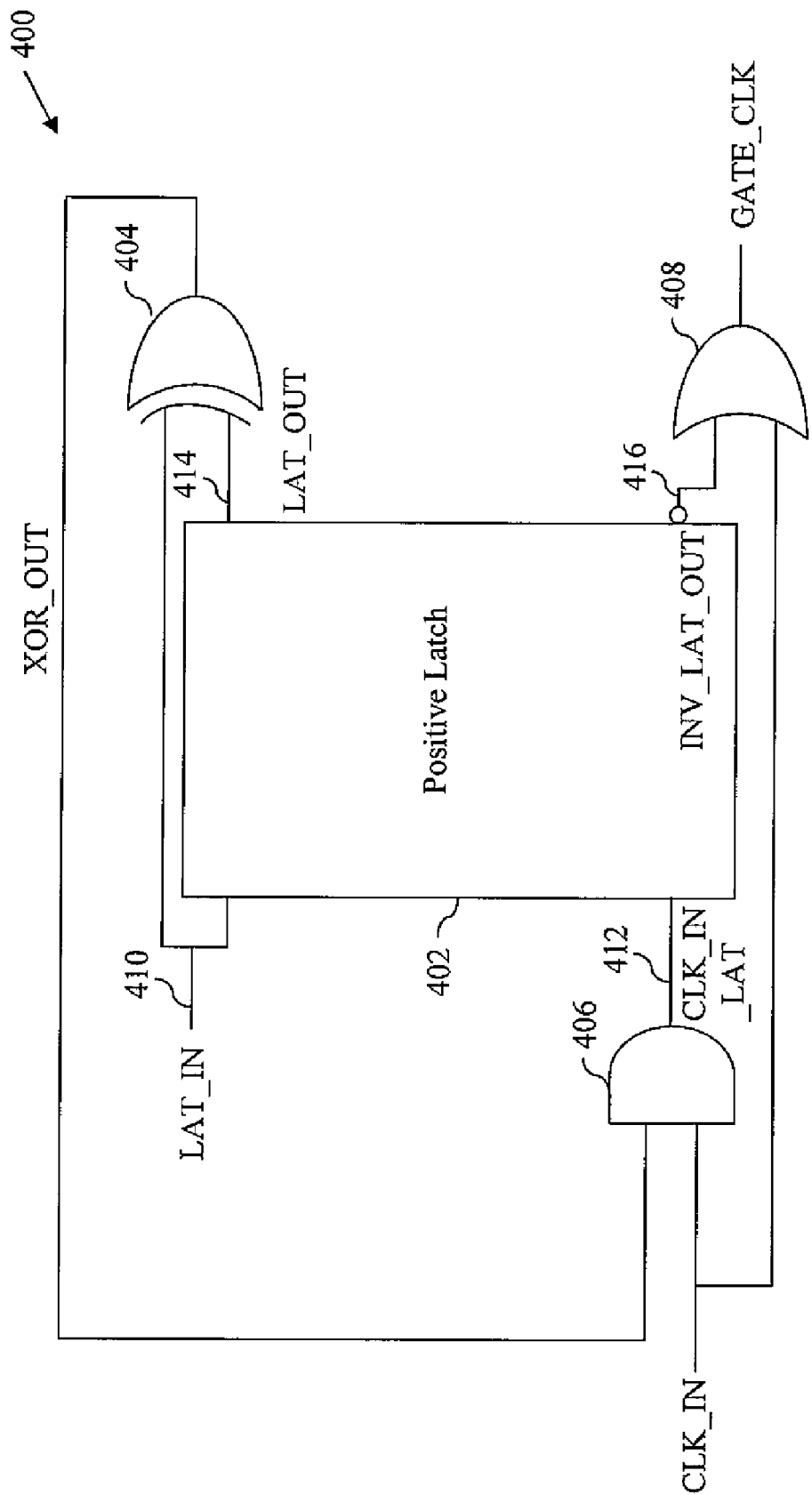
FIG. 4 is a schematic diagram illustrating a clock gating cell in accordance with another embodiment of the present invention.

Referring now to FIG. 4, a schematic diagram illustrating a clock gating cell 400 is shown, in accordance with another embodiment of the present invention. The clock gating cell 400 includes a positive latch circuit 402, a comparison logic circuit 404, a first logic circuit 406, and a second logic circuit 408. Further, the positive latch circuit 402 includes an input stage 410, a clock input stage 412, an output stage 414, and an inverted output stage 416.

An input signal (LAT_IN) is provided at the input stage 410 of the positive latch circuit 402. An output signal (LAT_OUT) is provided by the output stage 414, and an inverted output signal (INV_LAT_OUT) is provided by the inverted output stage 416. LAT_IN and LAT_OUT are provided to the input of the comparison logic circuit 404. The comparison logic circuit 404 compares LAT_IN and LAT_OUT to generate a comparison signal (XOR_OUT). XOR_OUT and an input clock signal (CLK_IN) are provided to the input of the first logic circuit 406. The first logic circuit 406 switches CLK_IN between a first state and a second state based on XOR_OUT, thereby generating a latch clock signal (CLK_IN_LAT). Thereafter, CLK_IN_LAT is provided to the clock input stage 412 to trigger a latch operation of the positive latch circuit 402. Subsequently, INV_LAT_OUT and CLK_IN are provided to the input of the second logic circuit 408. The second logic circuit 408 generates a gated clock signal (GATE_CLK) based on INV_LAT_OUT and CLK_IN.

In various embodiments of the present invention, the comparison logic circuit 404 may be a logic XOR gate. Further, the first logic circuit 406 may be a logic AND gate, and the second logic circuit 408 may be a logic OR gate. Furthermore, the positive latch circuit 402 may have a plurality of input stages such as the input stage 410. In an embodiment of the present invention, the first state of CLK_IN may be a high state and the second state of CLK_IN may be a low state or vice-versa.

In an embodiment of the present invention, the positive latch circuit 402 may be a positive D latch. In another embodiment of the present invention, the positive latch circuit 402 may be a positive SR latch. In yet another embodiment of the present invention, the positive latch circuit 402 may be a positive JK latch.

Figure 5:
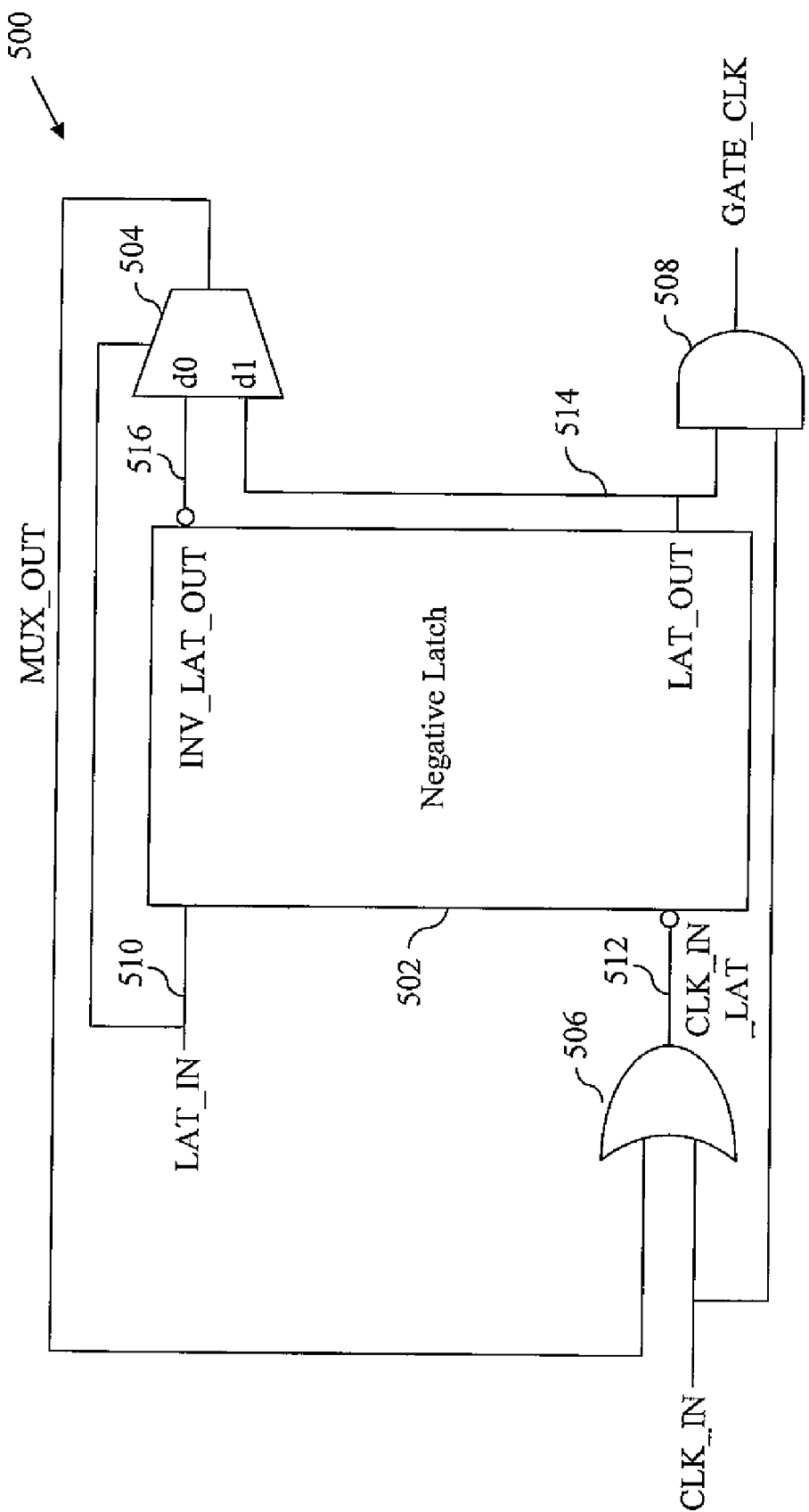
FIG. 5 is a schematic diagram illustrating a clock gating cell in accordance with yet another embodiment of the present invention.

Referring now to FIG. 5, a schematic diagram illustrating a clock gating cell 500 is shown, in accordance with yet another embodiment of the present invention. The clock gating cell 500 includes a negative latch circuit 502, a multiplexer circuit 504, a first logic circuit 506, and a second logic circuit 508. Further, the negative latch circuit 502 includes an input stage 510, a clock input stage 512, an output stage 514, and an inverted output stage 516.

An input signal (LAT_IN) is provided at the input stage 510 of the negative latch circuit 502. An output signal (LAT_OUT) is provided by the output stage 514 and an inverted output signal (INV_LAT_OUT) is provided by the inverted output stage 516. Subsequently, LAT_OUT and INV_LAT_OUT are provided to the input of the multiplexer circuit 504, and LAT_IN is provided to the select terminal of the multiplexer circuit 504. The multiplexer circuit 504 selects either LAT_OUT or INV_LAT_OUT based on LAT_IN to generate a comparison signal (MUX_OUT). MUX_OUT and an input clock signal (CLK_IN) are provided to the input of the first logic circuit 506. The first logic circuit 506 switches CLK_IN between a first state and a second state based on MUX_OUT, thereby generating a latch clock signal (CLK_IN_LAT). Thereafter, an inverted CLK_IN is provided to the clock input stage 512 to trigger a latching operation of the negative latch circuit 502. Subsequently, LAT_OUT and CLK_IN are provided to the input of the second logic circuit 508. The second logic circuit 508 generates a gated clock signal (GATE_CLK) based on LAT_OUT and CLK_IN.

In various embodiments of the present invention, the first logic circuit 506 may be a logic OR gate, and the second logic circuit 508 may be a logic AND gate. Furthermore, the positive latch circuit 502 may have a plurality of input stages such as the input stage 510. In an embodiment of the present invention, the first state of CLK_IN may be a high state and the second state of CLK_IN may be a low state or vice-versa.

In an embodiment of the present invention, the negative latch circuit 502 may be a negative D latch. In another embodiment of the present invention, the negative latch circuit 502 may be a negative SR latch. In yet another embodiment of the present invention, the negative latch circuit 502 may be a negative JK latch.

Figure 6:
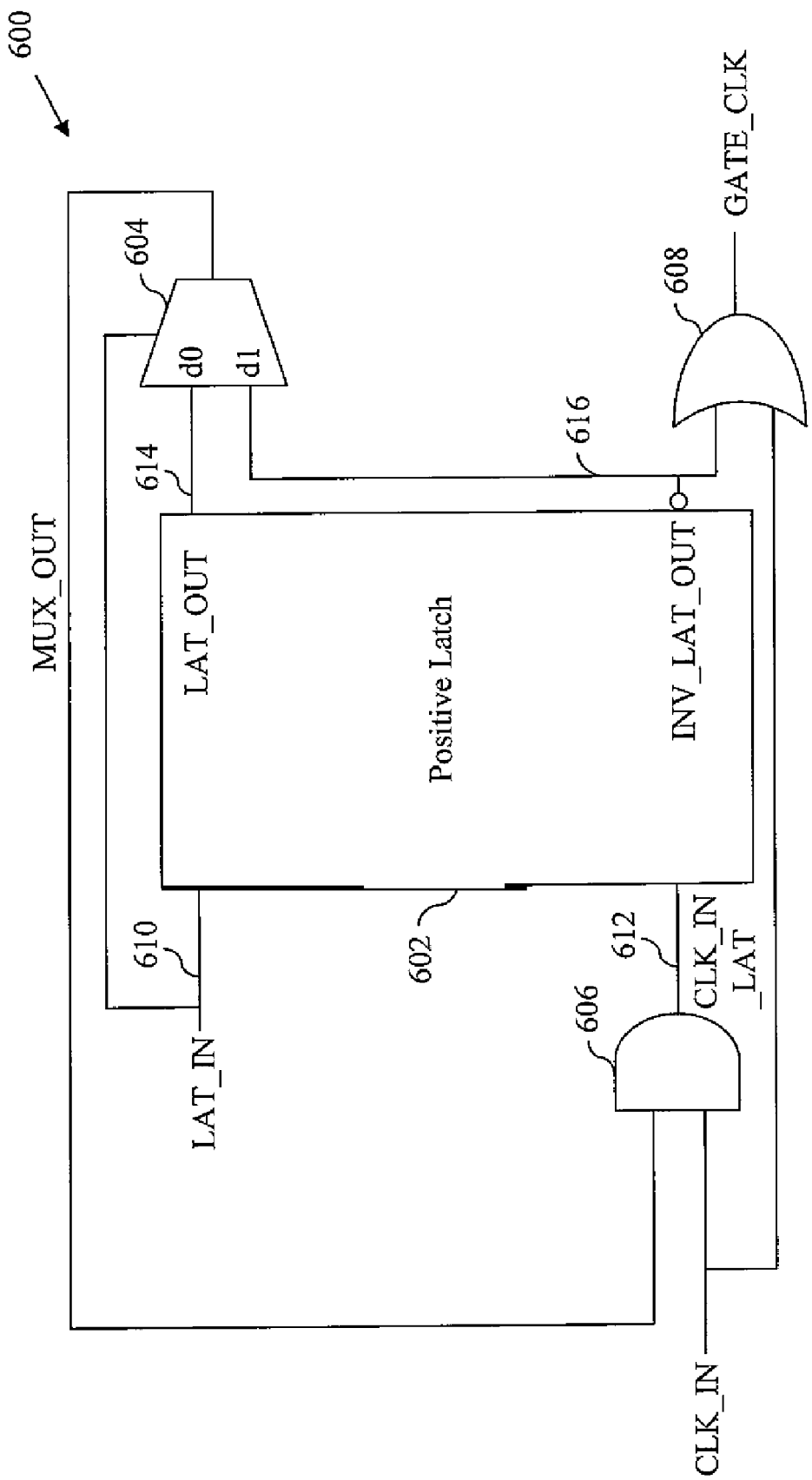
FIG. 6 is a schematic diagram illustrating a clock gating cell in accordance with still another embodiment of the present invention.

Referring now to FIG. 6, a schematic diagram illustrating a clock gating cell 600 is shown, in accordance with still another embodiment of the present invention. The clock gating cell 600 includes a positive latch circuit 602, a multiplexer circuit 604, a first logic circuit 606, and a second logic circuit 608. Further, the negative latch circuit 602 includes an input stage 610, a clock input stage 612, an output stage 614, and an inverted output stage 616.

An input signal (LAT_IN) is provided at the input stage 610 of the positive latch circuit 602. An output signal (LAT_OUT) is provided by the output stage 614 and an inverted output signal (INV_LAT_OUT) is provided by the inverted output stage 616. LAT_OUT and INV_LAT_OUT are provided to the input of the multiplexer circuit 604, and LAT_IN is provided to the select terminal of the multiplexer circuit 604. The multiplexer circuit 604 selects either LAT_OUT or INV_LAT_OUT based on LAT_IN to generate a comparison signal (MUX_OUT). MUX_OUT and an input clock signal (CLK_IN) are provided to the input of the first logic circuit 606 that is connected to the clock input stage 612. The first logic circuit 606 switches CLK_IN between a first state and a second state based on MUX_OUT, thereby generating a latch clock signal (CLK_IN_LAT). Thereafter, CLK_IN_LAT is provided to the clock input stage 612 to trigger a latch operation of the positive latch circuit 602. Subsequently, INV_LAT_OUT and CLK_IN are provided to the input of the second logic circuit 608. The second logic circuit 608 generates a gated clock signal (GATE_CLK) based on INV_LAT_OUT and CLK_IN.

In various embodiments of the present invention, the first logic circuit 606 may be a logic AND gate, and the second logic circuit 608 may be a logic OR gate. Furthermore, the positive latch circuit 602 may have a plurality of input stages such as the input stage 610. In an embodiment of the present invention, the first state of CLK_IN may be a high state and the second state of CLK_IN may be a low state or vice-versa.

In an embodiment of the present invention, the positive latch circuit 602 may be a positive D latch. In another embodiment of the present invention, the positive latch circuit 602 may be a positive SR latch. In yet another embodiment of the present invention, the positive latch circuit 602 may be a positive JK latch.

Figure 7A:
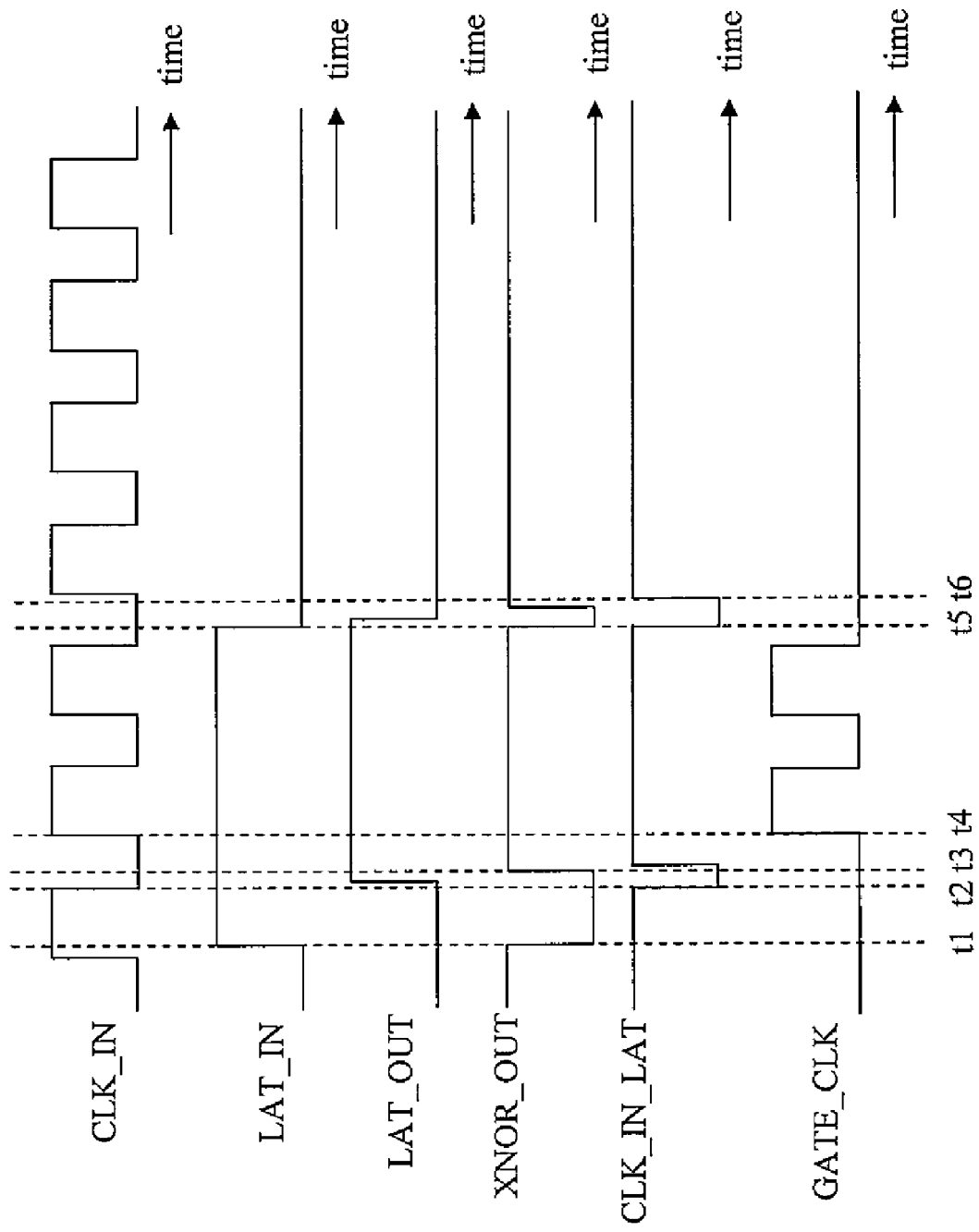
FIGS. 7A and 7B are timing diagrams illustrating exemplary operations of a clock gating cell in accordance with various embodiments of the present invention.

Referring now to FIG. 7A, a logic timing diagram illustrating an exemplary operation of the clock gating cell 300 is shown, in accordance with various embodiments of the present invention. The logic timing diagram includes waveforms for an input clock signal (CLK_IN), an input signal (LAT_IN), an output signal (LAT_OUT), a comparison signal (XNOR_OUT), a latch clock signal (CLK_IN_LAT), and a gated clock signal (GATE_CLK).

At time t1, LAT_IN becomes high and LAT_OUT remains low. Consequently, XNOR_OUT becomes low. At time t2, CLK_IN switches to low state. Since both XNOR_OUT and CLK_IN are provided at the input of the first logic circuit 306, CLK_IN_LAT switches to low state. Subsequently, since CLK_IN_LAT has switched to low state, LAT_IN gets latched to the output stage 314, i.e., LAT_OUT obtained from the output stage becomes equal to LAT_IN. LAT_OUT becomes high after a propagation delay associated with the negative latch circuit 302. Thereafter, at time t3, XNOR_OUT becomes high after a propagation delay associated with the comparison logic circuit 304, since both LAT_IN and LAT_OUT are high and are provided to the input of the comparison logic circuit 304. Subsequently, since XNOR_OUT is high, CLK_IN_LAT switches to high state after a propagation delay associated with the first logic circuit 306.

At time t4, CLK_IN switches to high state. GATE_CLK switches to high state, since CLK_IN and LAT_OUT are provided to the input of the second logic circuit 308. GATE_CLK switches synchronously with CLK_IN as long as LAT_OUT is high. At time t5, LAT_IN becomes low, and therefore, XNOR_OUT becomes low. Consequently, CLK_IN_LAT switches to low state. Since CLK_IN_LAT has switched to low state, LAT_IN gets latched to the output stage 314, i.e., LAT_OUT obtained from the output stage becomes equal to LAT_IN. LAT_OUT becomes low after a propagation delay associated with the negative latch circuit 302. Thereafter, XNOR_OUT becomes high after a propagation delay associated with the comparison logic circuit 304, since both LAT_IN and LAT_OUT are low. Consequently, at time t6, CLK_IN_LAT switches to high state after a propagation delay associated with the first logic circuit 306.

Figure 7B:
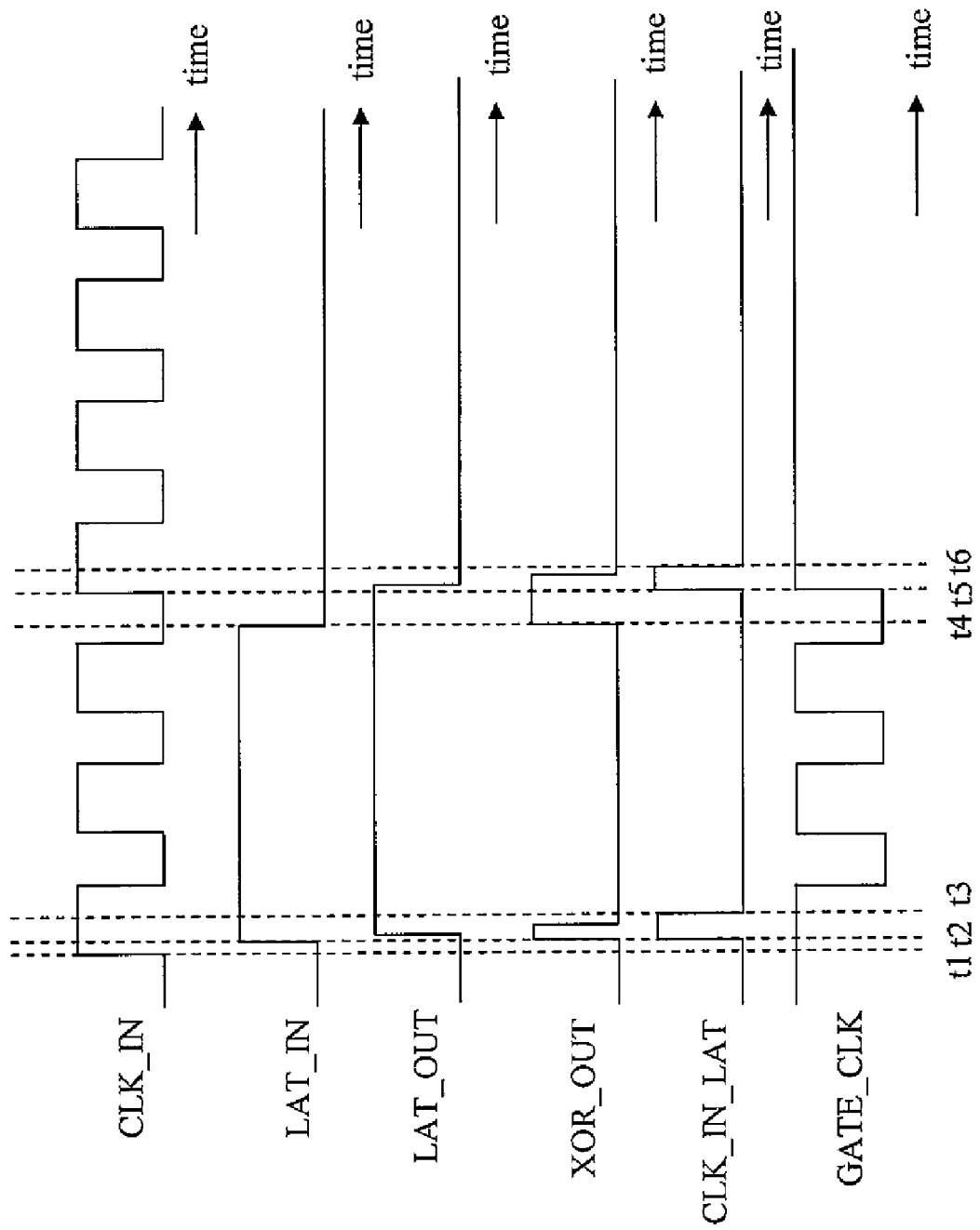

Referring now to FIG. 7B, a timing diagram illustrating an exemplary operation of the clock gating cell 400 is shown, in accordance with an embodiment of the present invention. The logic timing diagram includes waveforms for an input clock signal (CLK_IN), an input signal (LAT_IN), an output signal (LAT_OUT), a comparison signal (XOR_OUT), a latch clock signal (CLK_IN_LAT), and a gated clock signal (GATE_CLK).

At time t1, CLK_IN switches to a high state. GATE_CLK is high, since CLK_IN and an inverted LAT_OUT (INV_LAT_OUT) are provided to the input of the second logic circuit 408 and LAT_OUT is low. Thereafter, at time t2, LAT_IN becomes high followed by XOR_OUT becoming high, since LAT_OUT is low. CLK_IN_LAT becomes high, since both XOR_OUT and CLK_IN are high. Subsequently, LAT_IN gets latched to the output stage 414, i.e., LAT_OUT obtained from the output stage becomes equal to LAT_IN. LAT_OUT becomes high after a propagation delay associated with the positive latch circuit 402. Further, XOR_OUT becomes low after a propagation delay associated with the comparison logic circuit 404. Thereafter, at time t3, CLK_IN_LAT switches to low state after a propagation delay associated with the first logic circuit 406, since XOR_OUT is low. During the time period from time t1 to time t4, GATE_CLK switches synchronously with CLK_IN, since CLK_IN and INV_LAT_OUT are provided to the input of the second logic circuit 408.

At time t4, LAT_IN becomes low followed by XOR_OUT becoming high, since LAT_OUT is high. At time t5, CLK_IN switches to high state followed by CLK_IN_LAT switching to high state, since both XOR_OUT and CLK_IN are high. Also, GATE_CLK switches to high state. Since CLK_IN_LAT has switched to high state, LAT_IN gets latched to the output stage 414, i.e., LAT_OUT obtained from the output stage becomes equal to LAT_IN. LAT_OUT becomes low after a propagation delay associated with the positive latch circuit 402. Further, XOR_OUT becomes low after a propagation delay associated with the comparison logic circuit 404, since both LAT_IN and LAT_OUT are low. Consequently, at time t6, CLK_IN_LAT switches to low state after a propagation delay associated with the first logic circuit 406. Further, when LAT_OUT becomes low, GATE_CLK becomes high.

Figure 8:
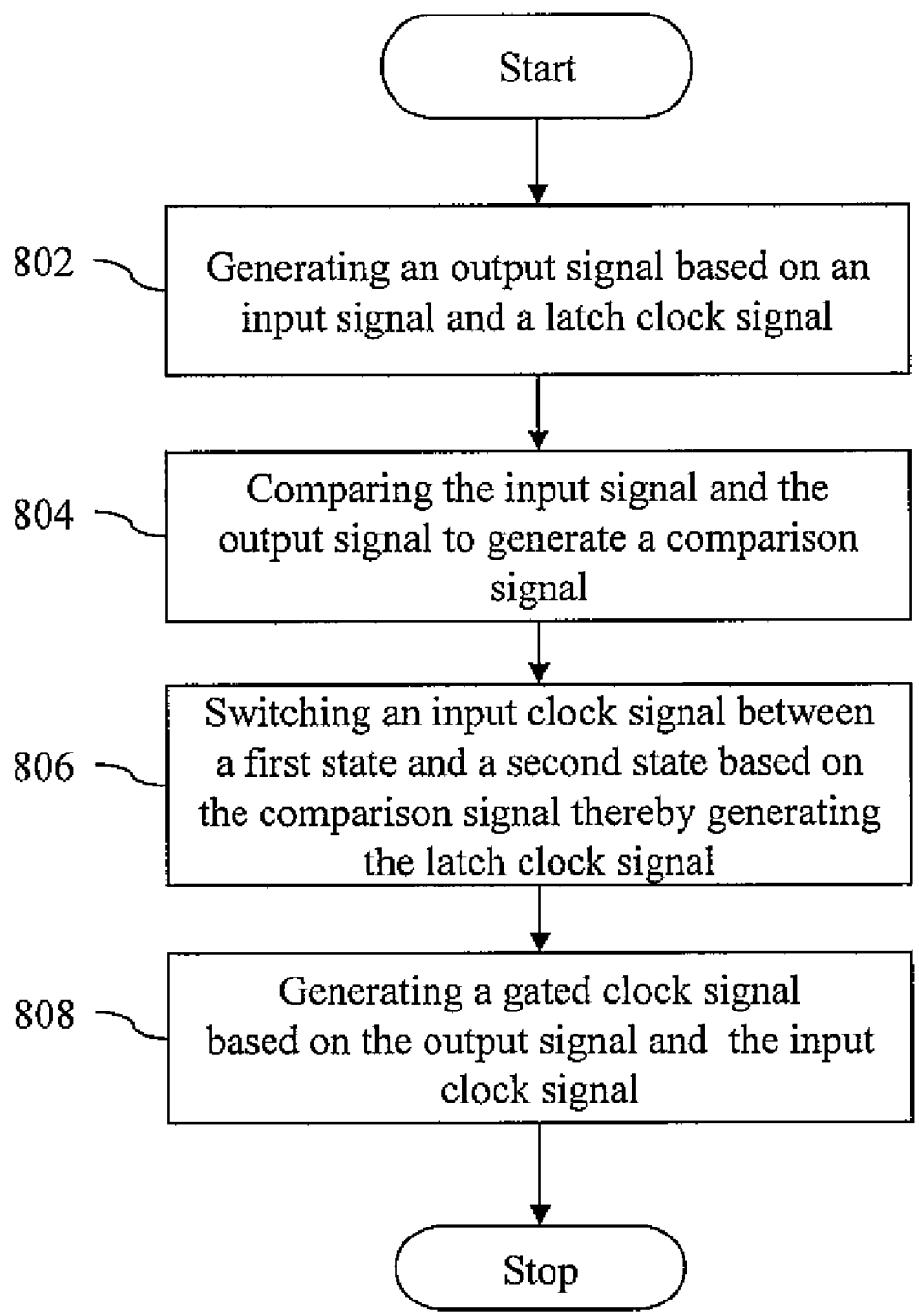
FIG. 8 is a flow chart illustrating a method for operating a clock gating cell in accordance with an embodiment of the present invention.

Referring now to FIG. 8, a flow chart illustrating a method for operating a clock gating cell is shown, in accordance with an embodiment of the present invention.

At step 802, an output stage, such as an output stage 314, generates an output signal based on an input signal and a latch clock signal. At step 804, a comparison circuit, such as a comparison circuit 304, compares the input signal and the output signal to generate a comparison signal. At step 806, a first logic circuit, such as a first logic circuit 306, switches an input clock signal between a first state and a second state based on the comparison signal, thereby generating the latch clock signal. In an embodiment of the present invention, the first state may be a high state and the second state may be a low state or vice-versa. Finally, at step 808 a second logic circuit, such as a second logic circuit 308, generates a gated clock signal based on the output signal and the input clock signal.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A clock gating cell for generating a gated clock signal, comprising:
   a latch circuit, comprising:
      at least one input stage for receiving an input signal;
      a clock input stage for receiving a latch clock signal;
      at least one output stage for providing an output signal based on the input signal and the latch clock signal;
   a comparison logic circuit connected to the at least one output stage for comparing the input signal and the output signal to generate a comparison signal;
   a first logic circuit connected to the clock input stage for switching an input clock signal between a first state and a second state based on the comparison signal, thereby generating the latch clock signal; and
   a second logic circuit for generating the gated clock signal based on the output signal and the input clock signal.

2. The clock gating cell of claim 1, wherein the latch circuit is a negative latch.

3. The clock gating cell of claim 2, wherein the comparison logic circuit comprises a logic XNOR gate.

4. The clock gating cell of claim 2, wherein the comparison logic circuit comprises a multiplexer.

5. The clock gating cell of claim 2, wherein the first logic circuit comprises a logic OR gate.

6. The clock gating cell of claim 2, wherein the second logic circuit comprises a logic AND gate.

7. The clock gating cell of claim 1, wherein the latch circuit is a positive latch.

8. The clock gating cell of claim 7, wherein the comparison logic circuit comprises a logic XOR gate.

9. The clock gating cell of claim 7, wherein the comparison logic circuit comprises a multiplexer.

10. The clock gating cell of claim 7, wherein the first logic circuit comprises a logic AND gate.

11. The clock gating cell of claim 7, wherein the second logic circuit comprises a logic OR gate.

12. A method for operating a clock gating cell, the clock gating cell comprising a latch circuit, the latch circuit receiving an input signal and a latch clock signal, comprising:
   generating an output signal based on the input signal and the latch clock signal;
   comparing the input signal and the output signal to generate a comparison signal;
   switching an input clock signal between a first state and a second state based on the comparison signal, thereby generating the latch clock signal; and
   generating a gated clock signal based on the output signal and the input clock signal.

* * * * *